United States Patent
Miyazaki et al.

(10) Patent No.: US 7,647,086 B2
(45) Date of Patent: Jan. 12, 2010

(54) APPARATUS AND METHOD FOR MAGNETIC RESONANCE ANGIOGRAPHY UTILIZING FLOW PULSES AND PHASE-ENCODING PULSES IN A SAME DIRECTION

(75) Inventors: Mitsue Miyazaki, Otawara (JP); Satoshi Sugiura, Otawara (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 988 days.

(21) Appl. No.: 10/678,309

(22) Filed: Oct. 6, 2003

(65) Prior Publication Data

US 2004/0068175 A1 Apr. 8, 2004

(30) Foreign Application Priority Data

Oct. 8, 2002 (JP) ............................. 2002-295190

(51) Int. Cl.
*A61B 5/05* (2006.01)

(52) U.S. Cl. ..................... 600/419; 600/407; 600/410; 600/412; 600/413; 600/414; 324/306; 324/307; 324/309

(58) Field of Classification Search ............... 600/419, 600/410, 413, 414, 412; 324/306, 307, 309
See application file for complete search history.

(56) References Cited

U.S. PATENT DOCUMENTS

| | | | | |
|---|---|---|---|---|
| 4,714,081 A | * | 12/1987 | Dumoulin et al. | 600/419 |
| 4,718,424 A | * | 1/1988 | Nishimura | 600/419 |
| 4,796,635 A | * | 1/1989 | Dumoulin | 600/413 |
| 5,277,182 A | * | 1/1994 | Koizumi et al. | 600/413 |
| 5,459,400 A | * | 10/1995 | Moonen | 324/309 |
| 5,853,365 A | * | 12/1998 | Yamagata | 600/410 |
| 5,869,964 A | * | 2/1999 | Kuhara et al. | 324/309 |
| 6,320,377 B1 | * | 11/2001 | Miyazaki et al. | 324/306 |

(Continued)

FOREIGN PATENT DOCUMENTS

JP 2000-5144 A 1/2000

(Continued)

OTHER PUBLICATIONS

M. Miyazaki et al., U.S. Appl. No. 09/773,380 entitled "MR Imaging Using ECG-Prep Scan", filed Feb. 21, 2001, Verification of a Translation, Official Filing Receipt, Declaration and Assignment therefor.

(Continued)

*Primary Examiner*—Brian Casler
*Assistant Examiner*—James Kish
(74) *Attorney, Agent, or Firm*—Nixon & Vanderhye PC

(57) ABSTRACT

A magnetic resonance imaging apparatus includes an RF coil unit which generates RF pulses toward a subject, and which receives an MR signal from the subject. Gradient magnetic field coils generate a gradient magnetic field for slice selection, a gradient magnetic field for phase encoding and a gradient magnetic field for frequency encoding, respectively. An arithmetic unit generates image data on the basis of the MR signal, and a sequence controller controls phase encoding gradient magnetic field coils in order to generate flow pulses for dephasing or rephasing the MR spin of blood flow within the subject, in the same direction as that of the phase encoding gradient magnetic field.

20 Claims, 12 Drawing Sheets

U.S. PATENT DOCUMENTS

| 7,047,062 | B2* | 5/2006 | Licato et al. | 600/410 |
|---|---|---|---|---|
| 2002/0032376 | A1* | 3/2002 | Miyazaki et al. | 600/410 |

FOREIGN PATENT DOCUMENTS

| JP | 2002-165771 | 6/2002 |
|---|---|---|
| JP | 2002-200054 | 7/2002 |

OTHER PUBLICATIONS

Miyazaki et al., "Non-Contrast-Enhanced MR Angiography Using 3D ECG-synchronized Half-Fourier Fast Spin Echo", Journal of Magnetic Resonance Imaging Society for Magnetic Resonance Imaging, Oak Brook, IL., US, vol. 12, No. 5, 2000, pp. 776-783, XP002285181.

Seiderer et al., "High Resolution MR Angiography with Rephasing and Dephasing Sequences for Selective Vascular Imaging of Arteries and Veins", Digitale Bilddiagnostik, Mar. 1988, vol. 8, No. 1, Mar. 1988, pp. 18-24, XP009043823.

Haacke et al., Optimizing Blood Vessel Contrast in Fast Three-Dimensional MRI, Magnetic Resonance in Medicine, Academic Press, Duluth, MN., US, vol. 14, No. 2, May 1, 1990, pp. 202-221, XP000141591.

Patent Abstracts of Japan, vol. 2000, No. 4, Aug. 31, 2000, & JP 2000 05144 A (Toshiba Corp.), Jan. 11, 2000.

Miyazaki et al., "Improvement in Separation of Arteries from Veins in Peripheral Non-Contrast MRA using Flow-Dephasing Spoiler Gradient Pulses in ECG-Triggered 3D Half-Fourier FSE", Proceedings of the International Society for Magnetic Resonance in Medicine, Tenth Meeting Proceedings, May 18, 2002, XP002317231.

Miyazaki et al., "Improvement in Delineation of Peripheral Arteries Using Non-Contrast-Enhanced 3D MRA with ECG-Triggered Half-Fourier FSE: Additional Spoiler Pulses in the Phase Encode Direction", Proceedings of the International Society for Magnetic Resonance in Medicine, Twelfth Meeting Proceedings, May 15, 2004, p. 1945, XP002317168.

European Search Report.

JP Office Action with translation dated Dec. 13, 2007.

Japanese office action dated Jan. 20, 2009, re JP 2002-295190, including English translation thereof.

Muruzen, "NMR Medicine—Basics and Clinical Trials, $2^{nd}$ Edition," *Magnetic Resonance Medical Society of Japan*, pp. 192-201 (Sep. 30, 1991).

Office Action mailed Aug. 19, 2008 in Patent Application No. JP 2000-295190 with English translation.

* cited by examiner

FIG. 13

|  |  | ORIGINAL | FLOW-COMP. | FLOW-SPOILED |
|---|---|---|---|---|
| SYSTOLIC PHASE | ARTERY | SMALL | MEDIUM | SMALL |
|  | VEIN | MEDIUM | LARGE | SMALL |
| DIASTOLIC PHASE | ARTERY | LARGE | LARGE | MEDIUM |
|  | VEIN | LARGE | LARGE | MEDIUM |

APPARATUS AND METHOD FOR MAGNETIC RESONANCE ANGIOGRAPHY UTILIZING FLOW PULSES AND PHASE-ENCODING PULSES IN A SAME DIRECTION

CROSS-REFERENCE TO RELATED APPLICATIONS

This application is based upon and claims the benefit of priority from the prior Japanese Patent Application No. 2002-295190, filed Oct. 8, 2002, the entire contents of which are incorporated herein by reference.

BACKGROUND OF THE INVENTION

1. Field of the Invention

The present invention relates to a magnetic resonance imaging apparatus and method which are furnished with MR angiography capable of separating an artery and a vein without using any contrast medium.

2. Description of the Related Art

Magnetic resonance imaging is an imaging method wherein the atomic nucleus spin of a subject located in a static magnetic field is magnetically excited by the radio frequency signal of its Larmor frequency, and wherein an image is reconstructed from a magnetic resonance signal generated with the excitation. One imaging method which has recently come into the limelight in the field of the magnetic resonance imaging, is MR angiography of the type which does not use any contrast medium.

In the MR angiography, flow pulses are used in order to dephase or rephase the magnetization spin of a specified blood flow. Thus, the signal intensity of the specified blood flow is lowered or heightened.

The flow pulses are utilized also for separating and imaging an artery and a vein. By way of example, the artery is assumed an object to-be-handled. Pulse sequences are executed in the diastolic phase and systolic phase of the heart by cardiac synchronization. An image in the diastolic phase and an image in the systolic phase are individually generated, and they are differenced. Thus, the artery is extracted. An extractability here is enhanced by scaling up the intensity difference between an artery signal in the diastolic phase and an artery signal in the systolic phase, and scaling down the intensity difference between a vein signal in the diastolic phase and a vein signal in the systolic phase.

For this purpose, it is important to optimize the time integral value of the intensities of the flow pulses in accordance with blood flow velocities. Since, however, the flow pulses are impressed on the same axis as that of a readout gradient magnetic field for frequency encoding, a temporal space which can be spared for the flow pulses in the pulse sequence is limited. Therefore, the flow pulses cannot be impressed with the optimal time integral value in some cases. Alternatively, an echo time must be sometimes prolonged in order to impress the flow pulses with the optimal time integral value.

BRIEF SUMMARY OF THE INVENTION

An object of the present invention is to realize MR angiography whose blood flow extractability is high.

A magnetic resonance imaging apparatus comprises an RF coil unit which generates RF pulses toward a subject, and which receives an MR signal from the subject, gradient magnetic field coils which generate a gradient magnetic field for slice selection, a gradient magnetic field for phase encoding and a gradient magnetic field for frequency encoding, respectively, an arithmetic unit which generates image data on the basis of the MR signal, and a sequence controller which controls the phase encoding gradient magnetic field coils in order to generate flow pulses for dephasing or rephasing a spin of a blood flow within the subject, in the same direction as that of the phase encoding gradient magnetic field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a table showing the differences of the signal intensities of an artery and a vein as depend upon the types of flow pulses, in this embodiment;

DETAILED DESCRIPTION OF THE INVENTION

Now, an embodiment according to the present invention will be described with reference to the drawings.

Figure 1:
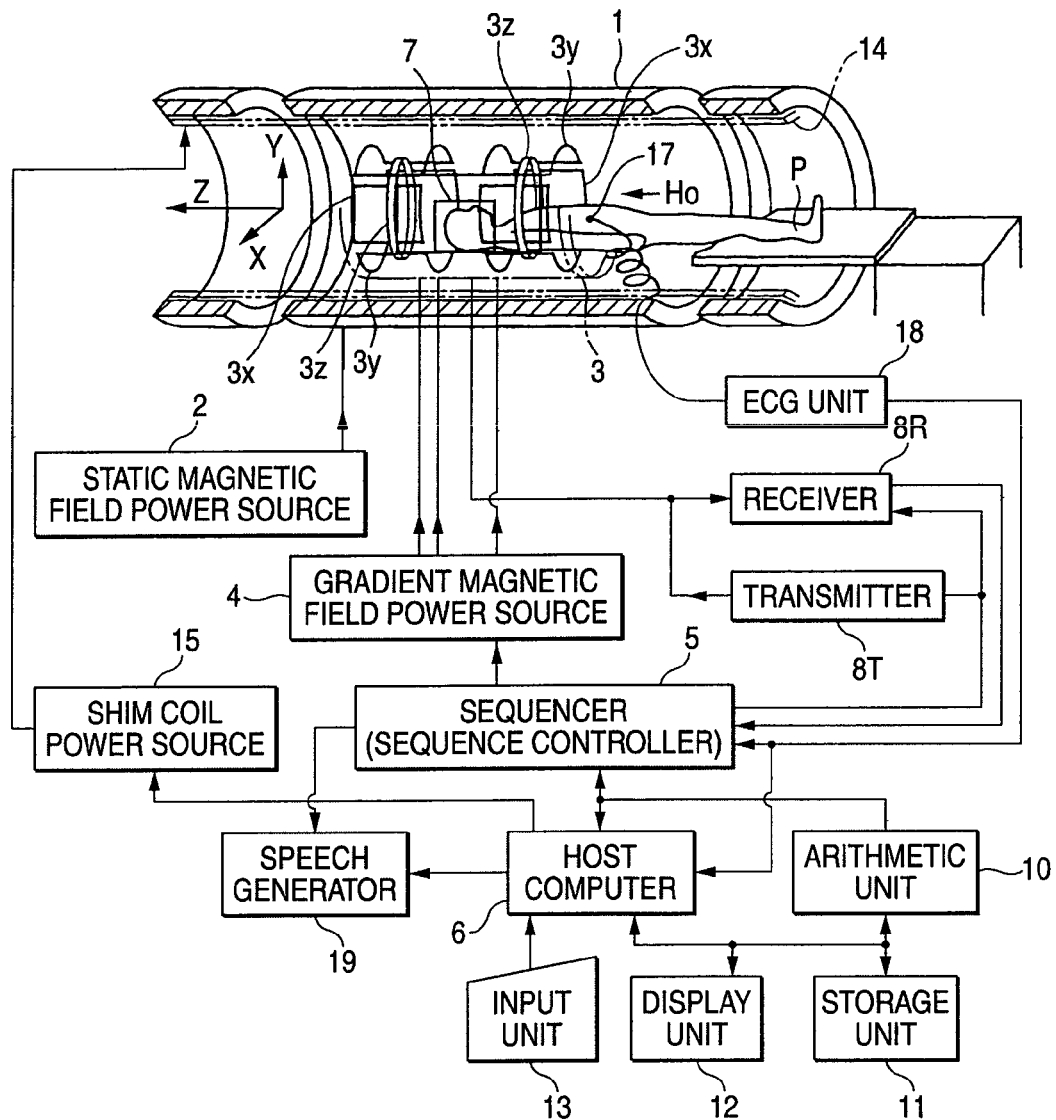
FIG. 1 is a diagram showing the construction of a magnetic resonance imaging apparatus according to an embodiment of the present invention.

FIG. 1 shows the schematic construction of a magnetic resonance imaging apparatus according to this embodiment. The magnetic resonance imaging apparatus includes a patient couch section on which a patient P being a subject is laid, a static magnetic field generation section which generates a static magnetic field, a gradient magnetic field generation section which serves to add positional information to the static magnetic field, a transmission/reception section which transmits/receives an RF (radio frequency) signal, a control/calculation section which takes charge of the control of the whole system and image reconstruction, an electrocardiographic measurement section which measures an ECG (electrocardiogram) signal being a signal representative of the cardiac phase of the patient P, and a breathholding command section which commands the patient P to suspend respiration.

The static magnetic field generation section includes a magnet 1 of, for example, superconducting scheme, and a static magnetic field power source 2 which feeds current to the magnet 1. It generates the static magnetic field H0 in the longitudinal direction (the direction of a Z-axis) of a cylindrical opening (diagnostic space) into which the subject P is loosely inserted. Incidentally, a shim coil 14 is disposed in the magnet section. The shim coil 14 is fed with current for homogenizing the static magnetic field, from a shim coil power source 15 under the control of a host computer 6 to be stated later. The patient couch section can retreatably insert a tabletop bearing the subject P, into the opening of the magnet 1.

The gradient magnetic field generation section includes a gradient magnetic field coil unit 3 which is built in the magnet 1. The gradient magnetic field coil unit 3 includes three sets (sorts) of x-, y- and z-coils 3x-3z which serve to generate gradient magnetic fields in the directions of an X-axis, a Y-axis and the Z-axis orthogonal to one another. The gradient magnetic field section further includes a gradient magnetic field power source 4 which feeds currents to the x-, y- and z-coils 3x-3z. More specifically, the gradient magnetic field power source 4 feeds the pulse currents for causing the x-, y- and z-coils 3x-3z to generate the gradient magnetic fields, under the control of a sequencer 5 to be stated later.

When the pulse currents which are fed from the gradient magnetic field power source 4 to the x-, y- and z-coils 3x-3z are controlled, the directions of a gradient magnetic field Gs in a slice direction, a gradient magnetic field Gpe in a phase encoding direction and a gradient magnetic field Gro in a frequency encoding direction (readout direction) can be set and altered at will by combining the gradient magnetic fields in the directions of the three axes X, Y and Z. The gradient magnetic fields in the slice direction, phase encoding direction and readout direction are superposed on the static magnetic field H0.

The transmission/reception section includes an RF (radio frequency) coil 7 which is disposed near the patient P in a radiographic space inside the magnet 1, and a transmitter 8T and a receiver 8R which are connected to the RF coil 7. Under the control of the sequencer 5 to be stated later, the transmitter 8T feeds the RF coil 7 with the RF current pulses of the Larmor frequency for exciting nuclear magnetic resonance (NMR), while the receiver 8R receives an MR signal (radio frequency signal) received by the RF coil 7. The received signal is subjected to various items of signal processing, so as to form corresponding digital data.

Further, the control/calculation section includes the sequencer (also called "sequence controller") 5, the host computer 6, an arithmetic unit 10, a storage unit 11, a display unit 12 and an input unit 13. Among them, the host computer 6 functions to give the sequencer 5 pulse sequence information in accordance with a stored software procedure, and to generalize the operations of the whole apparatus including the sequencer 5.

The sequencer 5 includes a CPU and a memory, and it stores the pulse sequence information sent from the host computer 6, so as to control the series of operations of the gradient magnetic field power source 4, transmitter 8T and receiver 8R in accordance with the information. Here, the "pulse sequence information" signifies all information items which are required for operating the gradient magnetic field power source 4, transmitter 8T and receiver 8R in accordance with a series of pulse sequences, and it contains, for example, information items on the intensities, impression time periods and impression timings of the pulse currents which are impressed on the x-, y- and z-coils 3x-3z. Besides, the sequencer 5 receives the digital data (MR signal) outputted by the receiver 8R and transfers the data to the arithmetic unit 10.

The pulse sequences may well be of two-dimensional (2D) scan or three-dimensional (3D) scan if the Fourier transform method is applicable. Besides, regarding the forms of pulse trains, it is possible to apply the SE (spin echo) method, the FE (field gradient echo) method, the FSE (fast SE) method, the EPI (echo planar imaging) method, the fast asymmetric SE method (FASE: technique in which the FSE method is combined with the half-Fourier method), etc.

Besides, the arithmetic unit 10 receives the digital data of the MR signal sent through the sequencer 5 from the receiver 8R, so as to execute the arrangement of original data (also called "raw data") into a Fourier space (also called "k-space" or "frequency space") and two-dimensional or three-dimensional Fourier transform processing for reconstructing the original data into an actual space image, and to execute the synthesis processing of image data. Incidentally, the Fourier transform processing may well be allotted to the host computer 6.

The storage unit 11 can save, not only the original data and reconstruction image data, but also image data subjected to various items of processing. The display unit 12 displays an image. Besides, information items containing the sorts of parameters, a scan condition, the sorts and parameters of pulse sequences, and an image processing method as desired by an operator, can he inputted to the host computer 6 through the input unit 13.

Besides, a speech generator 19 is included as a breathholding command unit. The speech generator 19 can vocally emit the messages, for example, of the start and end of breathholding when commanded by the host computer 6.

Further, the electrocardiographic measurement section includes an ECG sensor 17 which is stuck on the surface of the body of the patient P and which detects an ECG signal as an electric signal, and an ECG unit 18 which subjects the sensor signal to various items of processing including digitization processing and which outputs the processed signal to the host computer 6 and the sequencer 5. The measurement signal produced by the electrocardiographic measurement section is used by the host computer 6 and the sequencer 5 when prep scan and imaging scan are executed by the cardiac synchronization method.

Figure 2:
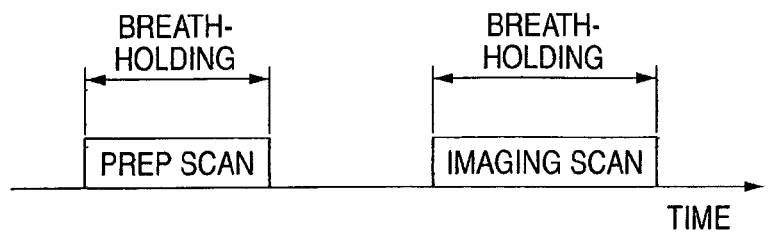
FIG. 2 is a chart showing the temporal relationship between a prep (preparatory) scan and an imaging scan in this embodiment.

Next, the operation of this embodiment will be described. In this embodiment, as shown in FIG. 2, the prep scan (preparatory scan) is performed before the imaging scan. The purpose of the prep scan is to investigate the optimal scan condition of the imaging scan. The imaging scan will be first explained, followed by the prep scan.

Figure 3:
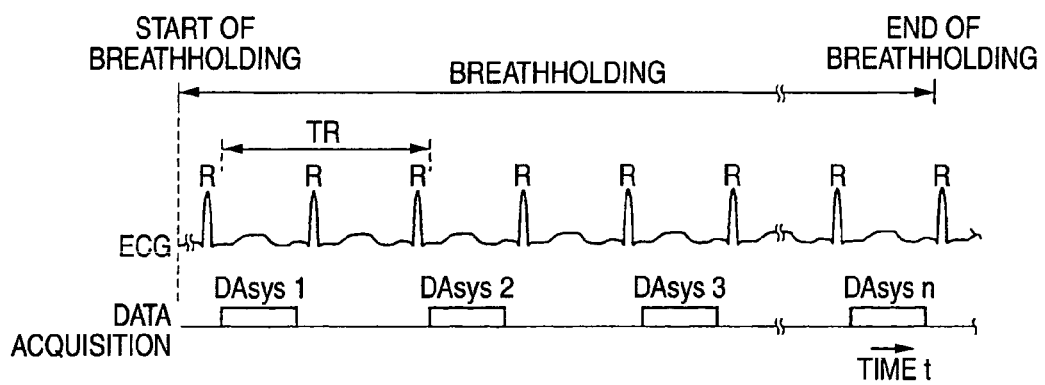
FIG. 3 is a chart showing the imaging scan of a systolic phase in this embodiment.
Figure 4:
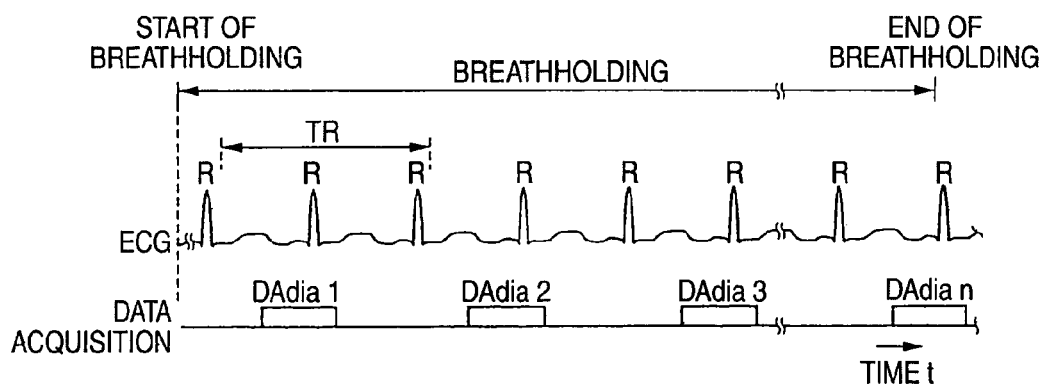
FIG. 4 is a chart showing the imaging scan of a diastolic phase in this embodiment.
Figure 5:
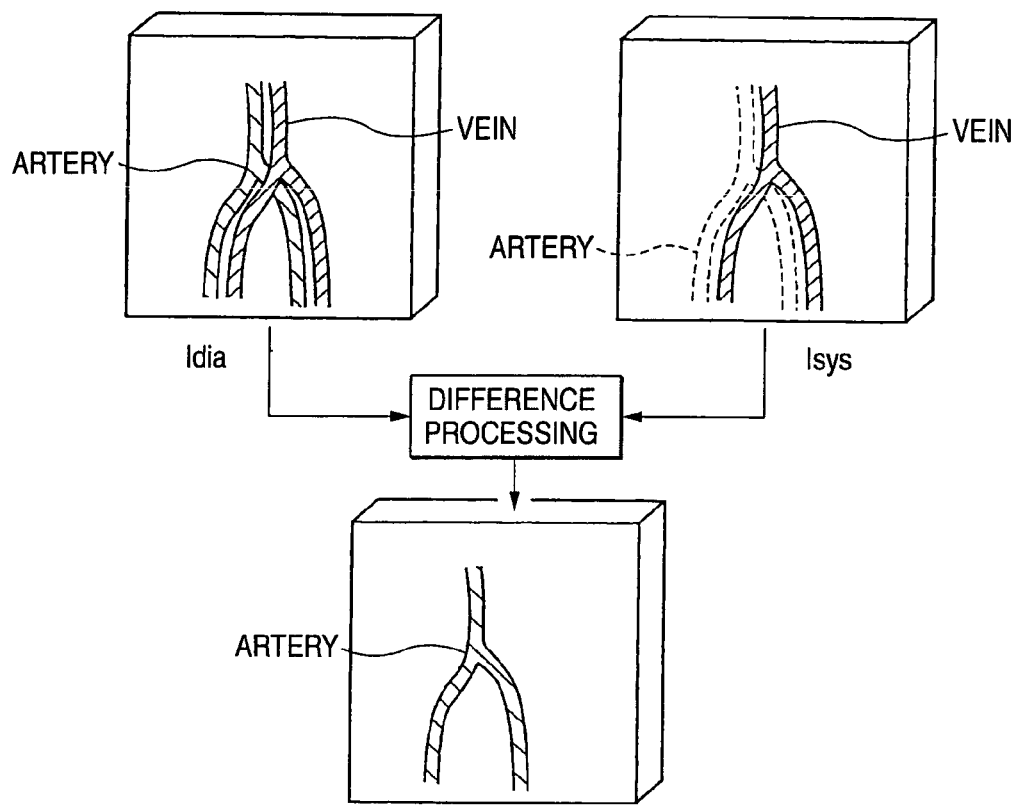
FIG. 5 is a diagram showing difference processing in this embodiment.

As shown in FIGS. 3 and 4, the imaging scan is performed twice in a systolic phase and a diastolic phase by utilizing cardiac synchronization. Besides, as shown in FIG. 5, an image Isys generated from a magnetic resonance signal acquired in the systolic phase, and an image Idia generated from a magnetic resonance signal acquired in the diastolic phase are differenced by the arithmetic unit 10. Owing to the differencing, an artery, for example, is extracted for a target blood flow, and a stationary part and a vein can be reduced. A condition suitable for the extraction of the target blood flow is determined by the prep scan.

Here, when the artery is exemplified for the target blood flow, the "optimal condition" is a condition under which the difference of artery signals becomes large between in the systolic phase and the diastolic phase, whereas the difference of vein signals becomes small between in the systolic phase and the diastolic phase. Flow pulses include the "rephase type" which heightens signal intensities, and the "dephase type" which lowers the signal intensities. Any of three choices; to adopt the rephase type, to adopt the dephase type, and to use no flow pulses, is selected. Further, when the flow pulses of the rephase type or the dephase type are adopted, the time integral value of the intensities of the flow pulses is determined.

Figure 6:
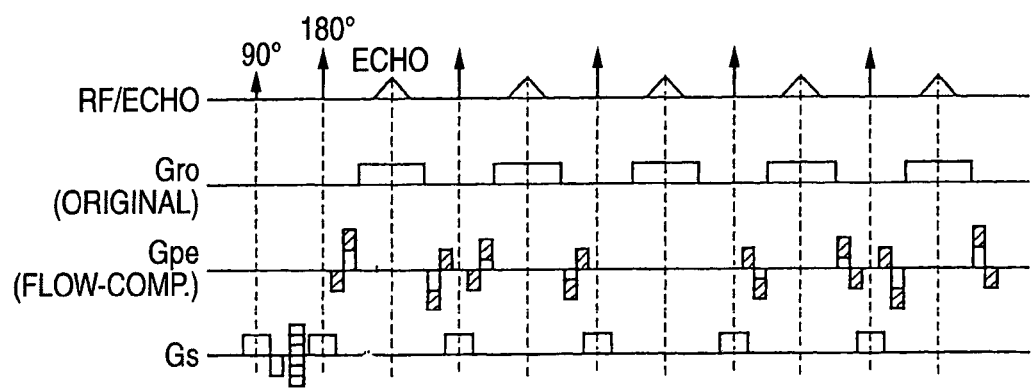
FIG. 6 is a chart showing pulse sequences in this embodiment.
Figure 7:
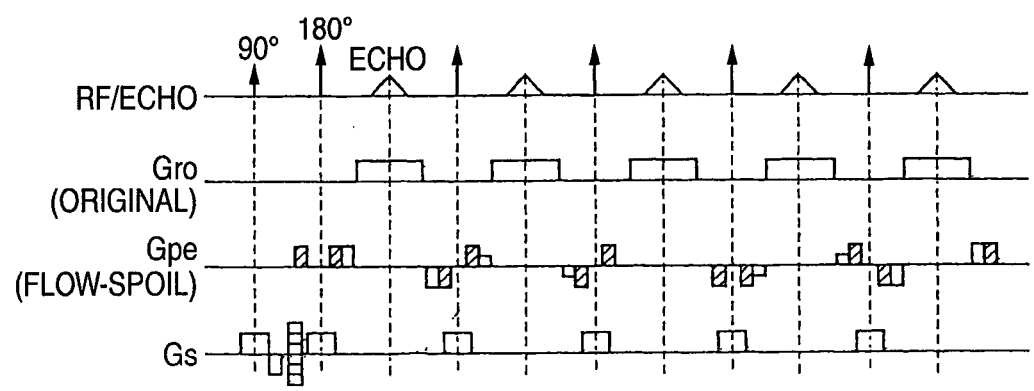
FIG. 7 is a chart showing different pulse sequences in this embodiment.

FIGS. 6 and 7 show two typical sorts of pulse sequences of the imaging scan which applies the FASE method. In the pulse sequences shown in FIG. 6, flow-compensation (flow-comp.) pulses indicated by hatching are adopted as the flow pulses of the rephase type. In the pulse sequences shown in FIG. 7, flow-spoiled (flow-spoil) pulses indicated by hatching are adopted as the flow pulses of the dephase type.

As is well known, the FASE method applies half-Fourier reconstruction to the fast SE method wherein a plurality of echoes are acquired by one time of excitation. Echo signals are arranged from near the center (zero encoding) of the k-space toward the outer edge thereof in succession. Radio-frequency magnetic field pulses (excitation pulses) whose flip angle is 90° are impressed together with slice-selecting gradient magnetic field pulses Gs. Thereafter, while radio-frequency magnetic field pulses (phase-inverted pulses) whose flip angle is 180° are being repeatedly impressed, the echo signals are repeatedly acquired in the existence of frequency-encoding (readout) gradient magnetic field pulses Gro. Since three-dimensional imaging is adopted here, the echo signals are endowed with phase encoding by gradient magnetic field pulses Gpe, and with slice encoding by the gradient magnetic field pulses Gs.

Figure 8:
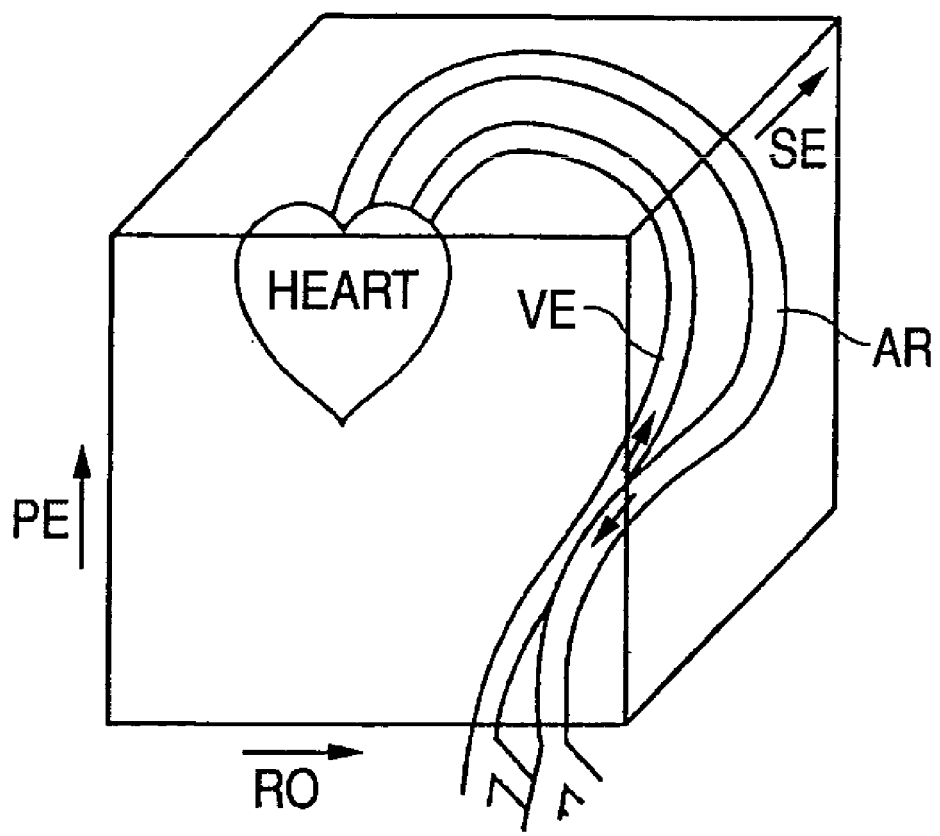
FIG. 8 is a diagram showing the relationship between a phase encoding (PE) direction and a blood flow direction in FIGS. 6 and 7.

Here, as shown in FIG. 8, a phase encoding direction PE is set to be substantially parallel to the direction of the target blood flow (here, artery AR). Thus, the running direction of the artery AR can be imaged without being omitted, more clearly than in a case where the phase encoding direction PE is set at a direction orthogonal to the blood flow direction. It has been generally known that the blood flow represented by a pulmonary blood vessel or the hepatic portal vein is somewhat short in the transverse relaxation time (T2). It has been revealed that the blood flow of shorter T2 widens in the half-value width of a signal as compared with the CSF (cerebrospinal fluid) or articular fluid of long T2. It can be said that, as compared with the CSF or articular fluid of long T2, the blood of short T2 (artery) is apparently and equivalently stretched in its width in the phase encoding direction per pixel. It is accordingly indicated that the whole image of the blood (artery) becomes less sharp in the phase encoding direction than that of the CSF or articular fluid.

Therefore, when the phase encoding direction PE is brought into substantial agreement with the blood flow direction, it can be positively utilized that the degree of spread (unsharpness) on the pixel, of the signal value of the blood of short T2 in the phase encoding direction PE is higher than in the case of long T2, and the blood flow is emphasized. Accordingly, when the optimal MRA image (that is, the optimal delay time) for the cardiac synchronization is to be selected as stated above, the selection is more facilitated.

Besides, the flow pulses, the flow-comp. pulses in FIG. 6 or the flow-spoil pulses in FIG. 7 need to be set in the direction of the target blood flow. They can be formed by the phase encoding gradient magnetic field Gpe for the reason that the phase encoding direction PE is brought into agreement with the blood flow direction.

Since the flow pulses are formed by the phase encoding gradient magnetic field Gpe, a temporal margin is afforded more than in case of forming the flow pulses by the frequency encoding gradient magnetic field Gro as in the prior art, and echo intervals can be shortened. Moreover, the flow pulses can be impressed with intensities which are necessary and sufficient for the separation between the artery and the vein.

Incidentally, although in the above, the flow pulses have been impressed in the phase encoding direction so as to image the blood flow in this direction, it is also possible that, as shown in each of FIGS. 9-12, flow pulses are impressed, not only in the phase encoding direction Gpe, but also the frequency encoding direction Gro, thereby to image also a blood flow in this direction.

Figure 9:
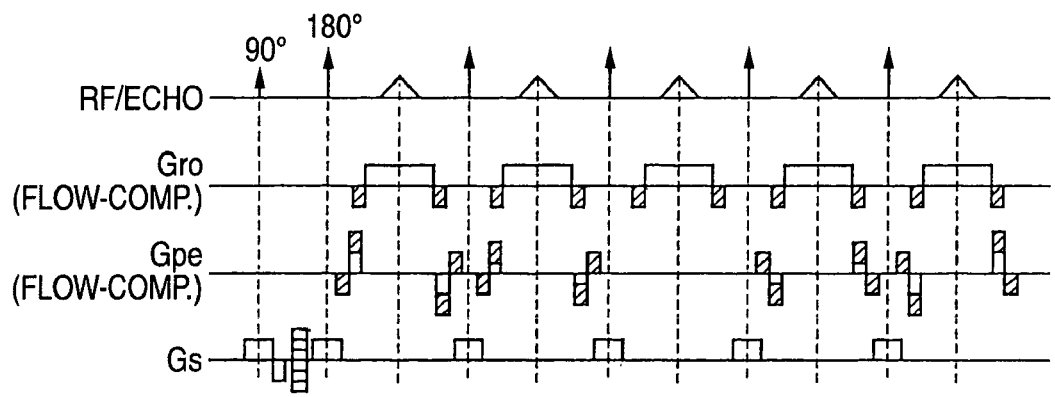
FIG. 9 is a chart showing pulse sequences for imaging blood flow components in the two directions of the phase encoding direction and a readout direction in this embodiment.
Figure 10:
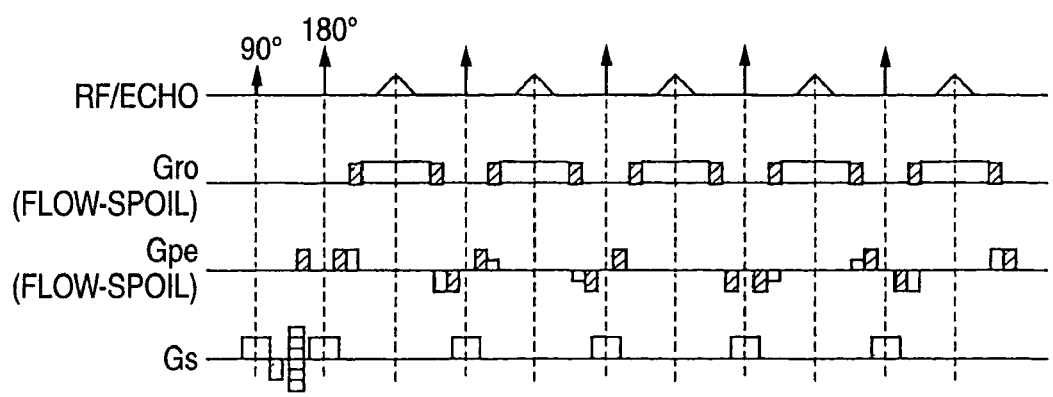
FIG. 10 is a chart showing second pulse sequences for imaging blood flow components in the two directions of the phase encoding direction and the readout direction in this embodiment.
Figure 11:
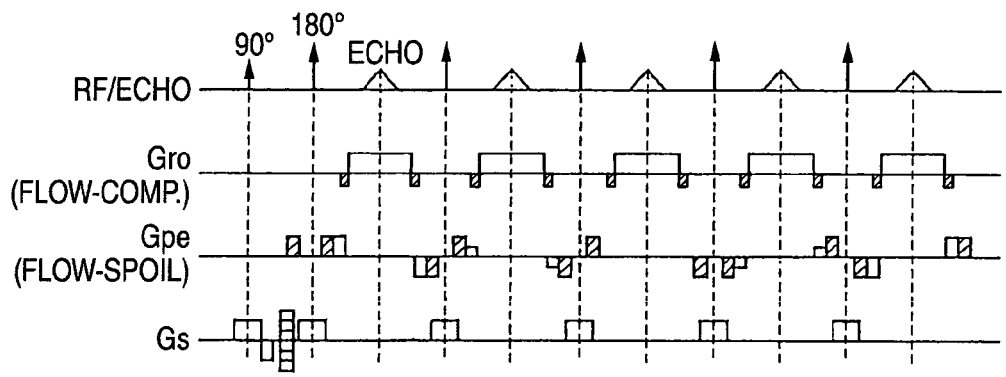
FIG. 11 is a chart showing third pulse sequences for imaging blood flow components in the two directions of the phase encoding direction and the readout direction in this embodiment.
Figure 12:
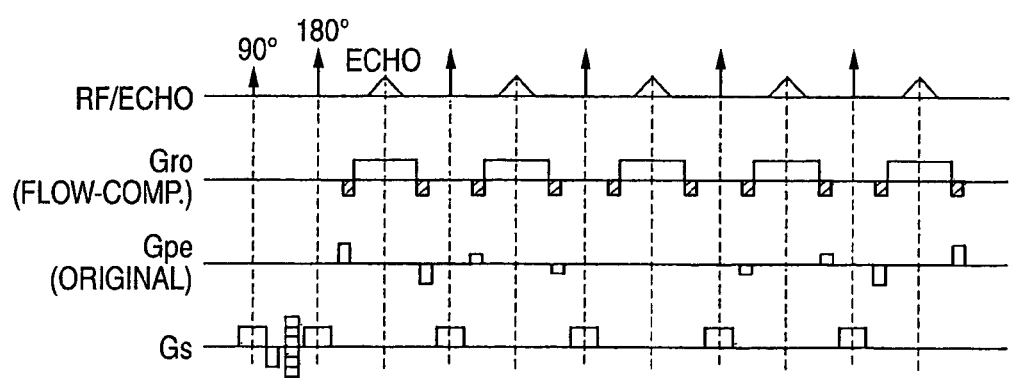
FIG. 12 is a chart showing fourth pulse sequences for imaging blood flow components in the two directions of the phase encoding direction and the readout direction in this embodiment.

FIG. 9 shows an example in which flow pulses of the same type as that in the phase encoding direction Gpe, here, flow pulses (flow-comp.) of the rephase type are impressed in the frequency encoding direction Gro. FIG. 10 shows an example in which flow pulses of the same type as that in the phase encoding direction Gpe, here, flow pulses (flow-spoiled) of the dephase type are impressed in the frequency encoding direction Gro. FIG. 11 shows an example in which flow pulses of the type different from that in the phase encoding direction Gpe are impressed in the frequency encoding direction Gro. More specifically, the flow pulses (flow-comp.) of the rephase type are impressed in the phase encoding direction Gpe, whereas the flow pulses (flow-spoiled) of the dephase type are impressed in the frequency encoding direction Gro. Alternatively, the flow pulses (flow-spoiled) of the dephase type are impressed in the phase encoding direction Gpe, whereas the flow pulses (flow-comp.) of the rephase type are impressed in the frequency encoding direction Gro. In some cases, as shown in FIG. 12, the blood flow is emphasized when the flow pulses are not impressed. Which of the patterns in FIGS. 9-12 the flow pulses are impressed in, is selected depending upon, for example, the part of the body. By way of example, the pattern in FIG. 10 is suitable for the periphery, the pattern in FIG. 11 for the renal vein, and the pattern in FIG. 12 for the chest.

The systolic phase image Isys and the diastolic phase image Idia are acquired by the imaging scan as stated above, and they are differenced simply or in weighted fashion, whereby the artery, for example, is extracted for the target blood flow, and an image in which the stationary part and the vein are reduced is obtained. The condition suitable for the extraction of the target blood flow is determined by the prep scan. As stated before, the "optimal condition" is defined as the condition under which the difference of the signals from the target blood flow becomes as large as possible between in the systolic phase and the diastolic phase, whereas the difference of the signals from the nontarget blood flow becomes as small as possible between them.

FIG. 13 shows the general tendencies of the respective signal intensities of the artery and the vein in the systolic phase and the diastolic phase, as to the case where the flow pulses are impressed in the rephase type (flow-compensation), the case where the flow pulses are impressed in the dephase type (flow-spoiled), and the case (original) where the flow pulses are not impressed. As stated before, the "optimal condition" for the separation between the artery and the vein is the condition under which the difference of the signals from the target blood flow becomes as large as possible between in the systolic phase and the diastolic phase, whereas the difference of the signals from the nontarget blood flow becomes as small as possible. They are determined depending upon whether the target blood is the artery or the vein, and also upon the blood flow velocities thereof.

Figure 14:
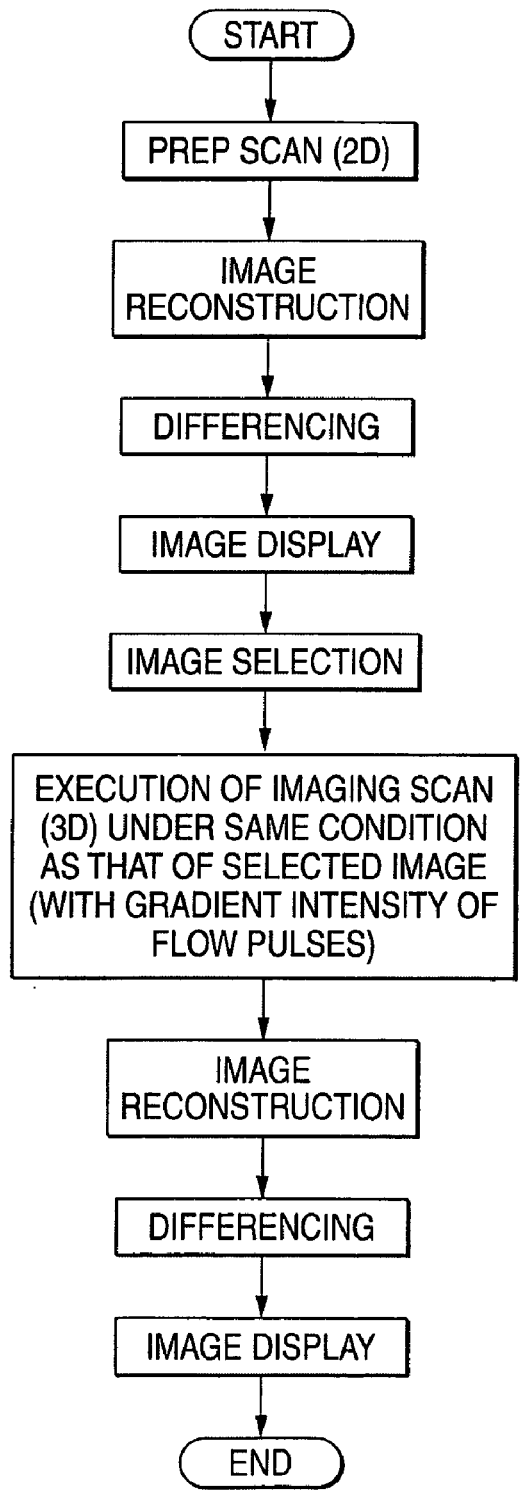
FIG. 14 is a flow chart showing the general flow of this embodiment.

In this embodiment, as shown in FIG. 14, the prep scan is actually executed under various conditions before the imaging scan, and the differenced image between the systolic phase image and the diastolic phase image is generated for each set of the conditions. Further, an operator (inspector) visually checks such differenced images, and he/she selects an image of the highest separability between the target blood flow and the nontarget blood flow from among the differenced images. Thereafter, the imaging scan is executed under the same flow pulse conditions as those of the pulse sequences with which the original signals of the selected image are acquired, that is, the conditions that the flow pulses of the rephase type or the dephase type are impressed or that the flow pulses are not used, and that the same intensities as those of the gradient magnetic field pulses as the flow pulses are set.

Figure 15:
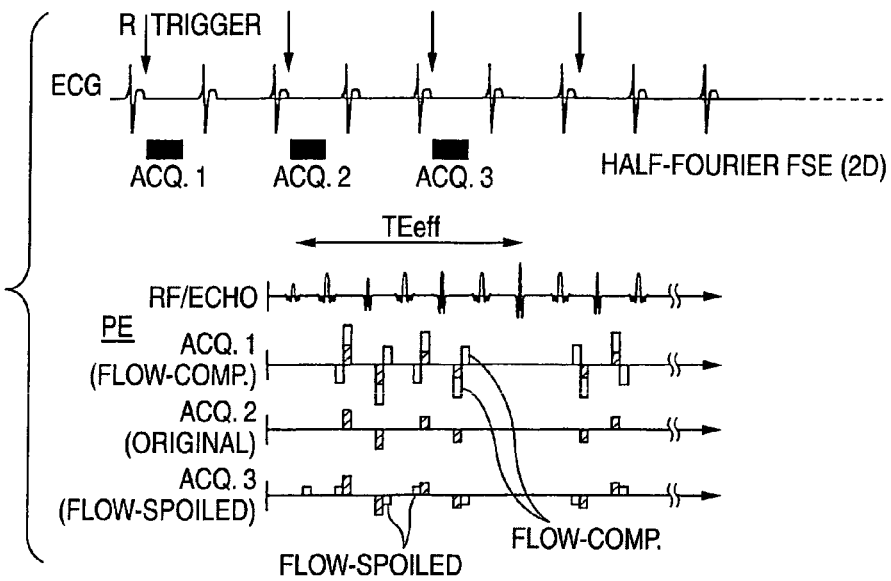
FIG. 15 is a chart showing the basic pulse sequences of the prep scan (systolic phase) in FIG. 14.
Figure 16:
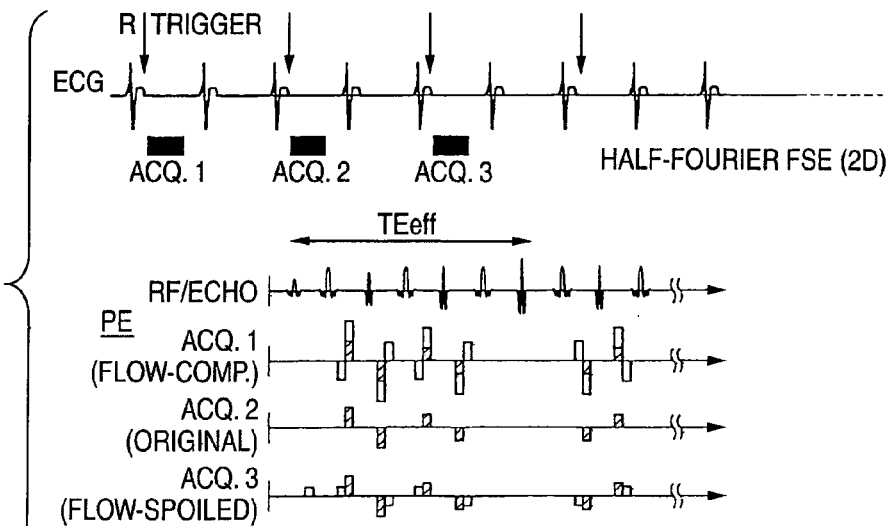
FIG. 16 is a chart showing the basic pulse sequences of the prep scan (diastolic phase) in FIG. 14.
Figure 17:
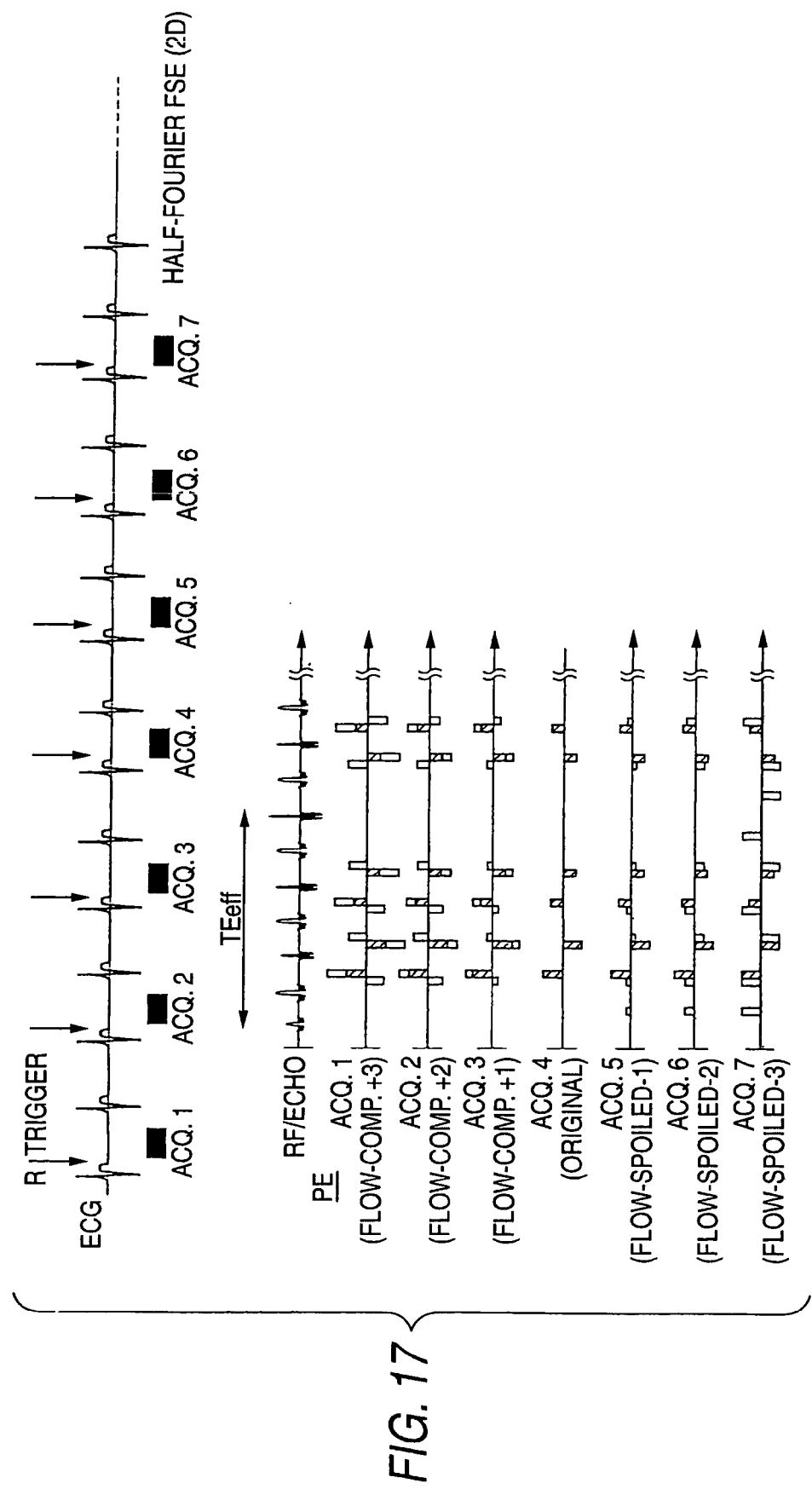
FIG. 17 is a chart showing the expansive pulse sequences of the prep scan (systolic phase) in FIG. 14.
Figure 18:
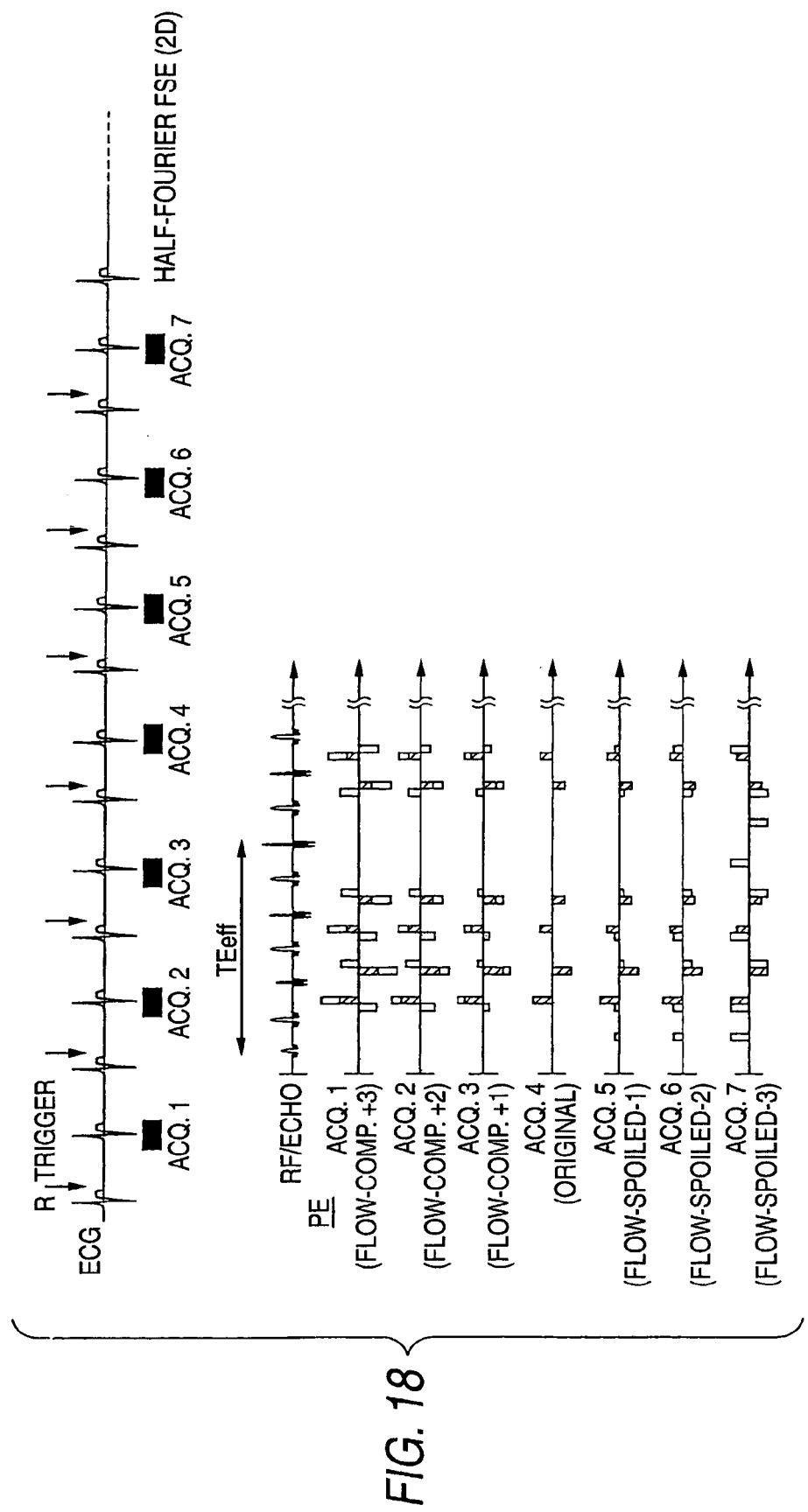
FIG. 18 is a chart showing the expansive pulse sequences of the prep scan (diastolic phase) in FIG. 14.

FIGS. 15 and 16 show a simple prep scan, while FIGS. 17 and 18 show an example of a prep scan for setting detailed conditions. The simple prep scan is done for the purpose of selecting any of the application of the rephase type flow pulses (flow-comp.), the application of the dephase type flow pulses (flow-spoiled), and the non-application (original) of the flow pulses. The detailed prep scan is done for the purpose of selecting intensities suitable for the flow pulses, in addition to the selection of any of the application of the rephase type flow pulses (flow-comp.), the application of the dephase type flow pulses (flow-spoiled), and the non-application (original) of the flow pulses. The prep scan of either of the types is selected by the operator beforehand.

With either of the types, the prep scan is executed by the same method as that of the imaging scan (here, by the FASE method), but in conformity with two-dimensional imaging. More specifically, radio-frequency magnetic field pulses (excitation pulses) whose flip angle is 90° are impressed together with slice-selecting gradient magnetic field pulses Gs. Thereafter, while radio-frequency magnetic field pulses (phase-inverted pulses) whose flip angle is 180° are being repeatedly impressed, echo signals are repeatedly acquired in the existence of frequency-encoding (readout) gradient magnetic field pulses Gro. Unlike the imaging scan, however, the prep scan adopts the two-dimensional imaging in order to shorten a prep scan time. Accordingly, the echo signals are endowed with phase encoding by the gradient magnetic field pulses Gpe, but they are not subjected to slice encoding. Besides, in the prep scan, the phase encoding direction PE is set to be substantially parallel to the direction of the target blood flow (the artery AR in FIG. 8) as in the imaging scan.

With the simple type, as shown in FIG. 15 or 16, a two-dimensional FASE-method pulse sequence which applies rephase type flow pulses (flow-comp.), a two-dimensional FASE-method pulse sequence which applies dephase type flow pulses (flow-spoiled), and a two-dimensional FASE-method pulse sequence (original) which does not apply flow pulses are executed in the systolic phase or the diastolic phase by utilizing cardiac synchronization.

An image which is reconstructed on the basis of echoes acquired in the systolic phase by the two-dimensional FASE-method pulse sequence applying the rephase type flow pulses (flow-comp.), and an image which is reconstructed on the basis of echoes acquired in the diastolic phase by the two-dimensional FASE-method pulse sequence applying the rephase type flow pulses (flow-comp.) are differenced simply or in weighted fashion, and the differenced image is displayed.

Likewise, an image which is reconstructed on the basis of echoes acquired in the systolic phase by the two-dimensional FASE-method pulse sequence applying the dephase type flow pulses (flow-spoiled), and an image which is reconstructed on the basis of echoes acquired in the diastolic phase by the two-dimensional FASE-method pulse sequence applying the dephase type flow pulses (flow-spoiled) are differenced simply or in weighted fashion, and the differenced image is displayed.

Besides, likewise, an image which is reconstructed on the basis of echoes acquired in the systolic phase by the two-dimensional FASE-method pulse sequence not applying the flow pulses, and an image which is reconstructed on the basis of echoes acquired in the diastolic phase by the two-dimensional FASE-method pulse sequence not applying the flow pulses are differenced simply or in weighted fashion, and the differenced image is displayed.

The operator visually checks the three sorts of images, and he/she selects the image in which the target blood flow, for example, the artery is extracted most clearly.

The imaging scan condition is set at the same flow condition as that of the selected image by the host computer 6 and the sequencer 5. More specifically, in case of selecting the differenced image between the image which is reconstructed on the basis of the echoes acquired in the systolic phase by the two-dimensional FASE-method pulse sequence applying the rephase type flow pulses (flow-comp.), and the image which is reconstructed on the basis of the echoes acquired in the diastolic phase by the two-dimensional FASE-method pulse sequence applying the rephase type flow pulses (flow-comp.), the imaging scan condition is set at a three-dimensional FASE-method pulse sequence which applies the rephase type flow pulses (flow-comp.).

Besides, in case of selecting the differenced image between the image which is reconstructed on the basis of the echoes acquired in the systolic phase by the two-dimensional FASE-method pulse sequence applying the dephase type flow pulses (flow-spoiled), and the image which is reconstructed on the basis of the echoes acquired in the diastolic phase by the two-dimensional FASE-method pulse sequence applying the dephase type flow pulses (flow-spoiled), the imaging scan condition is set at a three-dimensional FASE-method pulse sequence which applies the dephase type flow pulses (flow-spoiled).

Further, likewise, in case of selecting the differenced image between the image which is reconstructed on the basis of the echoes acquired in the systolic phase by the two-dimensional FASE-method pulse sequence not applying the flow pulses, and the image which is reconstructed on the basis of the echoes acquired in the diastolic phase by the two-dimensional FASE-method pulse sequence not applying the flow pulses, the imaging scan condition is set at a three-dimensional FASE-method pulse sequence which does not apply the flow pulses.

On the other hand, when the prep scan of the detailed setting type has been selected, it proceeds as shown in FIGS. 17 and 18. An image which is reconstructed on the basis of echoes acquired in the systolic phase by the two-dimensional FASE-method pulse sequence applying the rephase type flow pulses (flow-comp.) whose flow compensation effect is +3, namely, whose gradient magnetic field intensity is triple a reference intensity, and an image which is reconstructed on the basis of echoes acquired in the diastolic phase by the two-dimensional FASE-method pulse sequence applying the rephase type flow pulses (flow-comp.) whose flow compensation effect is +3, namely, whose gradient magnetic field intensity is triple the reference intensity are differenced simply or in weighted fashion, and the differenced image is displayed.

An image which is reconstructed on the basis of echoes acquired in the systolic phase by the two-dimensional FASE-method pulse sequence applying the rephase type flow pulses (flow-comp.) whose flow compensation effect is +2, namely, whose gradient magnetic field intensity is double the reference intensity, and an image which is reconstructed on the basis of echoes acquired in the diastolic phase by the two-dimensional FASE-method pulse sequence applying the rephase type flow pulses (flow-comp.) whose flow compensation effect is +2, namely, whose gradient magnetic field intensity is double the reference intensity are differenced simply or in weighted fashion, and the differenced image is displayed.

An image which is reconstructed on the basis of echoes acquired in the systolic phase by the two-dimensional FASE-method pulse sequence applying the rephase type flow pulses (flow-comp.) whose flow compensation effect is +1, namely, whose gradient magnetic field intensity is the reference intensity, and an image which is reconstructed on the basis of echoes acquired in the diastolic phase by the two-dimensional FASE-method pulse sequence applying the rephase type flow pulses (flow-comp.) whose flow compensation effect is +1, namely, whose gradient magnetic field intensity is the reference intensity are differenced simply or in weighted fashion, and the differenced image is displayed.

Besides, an image which is reconstructed on the basis of echoes acquired in the systolic phase by the two-dimensional FASE-method pulse sequence not applying the flow pulses, and an image which is reconstructed on the basis of echoes acquired in the diastolic phase by the two-dimensional FASE-method pulse sequence not applying the flow pulses are differenced simply or in weighted fashion, and the differenced image is displayed.

An image which is reconstructed on the basis of echoes acquired in the systolic phase by the two-dimensional FASE-method pulse sequence applying the dephase type flow pulses (flow-spoiled) whose flow compensation effect is −1 (flow suppression effect is +1), namely, whose gradient magnetic field intensity is the reference intensity, and an image which is reconstructed on the basis of echoes acquired in the diastolic phase by the two-dimensional FASE-method pulse sequence applying the dephase type flow pulses (flow–spoiled) whose flow compensation effect is −1 (flow suppression effect is +1), namely, whose gradient magnetic field intensity is the reference intensity are differenced simply or in weighted fashion, and the differenced image is displayed.

An image which is reconstructed on the basis of echoes acquired in the systolic phase by the two-dimensional FASE-method pulse sequence applying the dephase type flow pulses (flow-spoiled) whose flow compensation effect is −2 (flow suppression effect is +2), namely, whose gradient magnetic field intensity is double the reference intensity, and an image which is reconstructed on the basis of echoes acquired in the diastolic phase by the two-dimensional FASE-method pulse sequence applying the dephase type flow pulses (flow–spoiled) whose flow compensation effect is −2 (flow suppression effect is +2), namely, whose gradient magnetic field intensity is double the reference intensity are differenced simply or in weighted fashion, and the differenced image is displayed.

An image which is reconstructed on the basis of echoes acquired in the systolic phase by the two-dimensional FASE-method pulse sequence applying the dephase type flow pulses (flow-spoiled) whose flow compensation effect is −3 (flow suppression effect is +3), namely, whose gradient magnetic field intensity is triple the reference intensity, and an image which is reconstructed on the basis of echoes acquired in the diastolic phase by the two-dimensional FASE-method pulse sequence applying the dephase type flow pulses (flow-spoiled) whose flow compensation effect is −3 (flow suppression effect is +3), namely, whose gradient magnetic field intensity is triple the reference intensity are differenced simply or in weighted fashion, and the differenced image is displayed.

The operator visually checks the seven sorts of images, and he/she selects the image in which the target blood flow, for example, the artery is extracted most clearly.

The imaging scan condition is set at the same flow condition as that of the selected image by the host computer 6 and the sequencer 5. More specifically, in case of selecting the differenced image which corresponds to the two-dimensional FASE-method pulse sequence that applies the rephase type flow pulses (flow-comp.) having any of the flow compensation effects, the imaging scan condition is set at a three-dimensional FASE-method pulse sequence which applies the rephase type flow pulses (flow-comp.) having the same flow compensation effect, namely, the same gradient magnetic field intensity.

Besides, in case of selecting the differenced image which corresponds to the two-dimensional FASE-method pulse sequence that does not apply the flow pulses, the imaging scan condition is set at a three-dimensional FASE-method pulse sequence which does not apply the flow pulses.

Further, in case of selecting the differenced image which corresponds to the two-dimensional FASE-method pulse sequence that applies the dephase type flow pulses (flow-spoiled) having any of the flow suppression effects, the imaging scan condition is set at a three-dimensional FASE-method pulse sequence which applies the dephase type flow pulses (flow-spoiled) having the same flow suppression effect, namely, the same gradient magnetic field intensity.

Incidentally the numbers of stages of the flow compensation effect and the flow suppression effect which are attained in the prep scan of the detailed type can be set at will by the operator.

As thus far described, according to this embodiment, in an imaging scan, phase encoding pulses Gpe are impressed substantially in agreement with the direction of a target blood flow, and flow pulses are impressed in a phase encoding direction, whereby the effect of emphasizing the blood flow can be realized. Moreover, a temporal margin can be afforded to the flow pulse impression so as to shorten echo intervals and to impress the flow pulses at intensities necessary and sufficient for separating an artery and a vein.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) apparatus for providing MRA image data without use of contrast agent, said apparatus comprising:
an RF coil unit which transmits RE pulses toward a subject, and which receives an MR signal from the subject in the absence of contrast agent in said subject;
gradient magnetic field coils which generate gradients in a superposed background magnetic field $B_o$, said gradients being generated in respectively different spatial directions and including (a) a gradient magnetic field for slice selection, (b) a gradient magnetic field for phase encoding, and (c) a gradient magnetic field for frequency encoding;
an arithmetic unit which generates MRA image data based on the MR signal including a subtraction image related to a systolic phase and a diastolic phase on the basis of the MR signals acquired during the systolic phase and the diastolic phase;
a sequence controller which (a) executes a first MRI scanning process during a systolic phase of a subject's heart cycle and a second MRI scanning process during a diastolic phase of the subject's heart cycle, and (b) controls the phase encoding gradient magnetic field coils to generate magnetic gradient flow pulses for dephasing or rephasing MR spin of a blood flow within said subject in the same spatial direction as the phase encoding gradient magnetic field during at least one of the first and second scanning processes; and
a subtraction processing unit which subtracts from each other (a) a systolic phase image based on said first scanning process and (b) a diastolic phase image based on said second scanning process.

2. A magnetic resonance imaging apparatus as in claim 1, wherein the flow pulses are flow compensation pulses or flow spoiled pulses.

3. A magnetic resonance imaging apparatus as in claim 1, wherein said sequence controller controls the frequency encoding gradient magnetic field coils to generate additional flow pulses in the same spatial direction as the frequency encoding gradient magnetic field.

4. A magnetic resonance imaging apparatus as in claim 3, wherein the first-mentioned flow pulses are flow compensation pulses, and the additional flow pulses are also flow compensation pulses.

5. A magnetic resonance imaging apparatus as in claim 3, wherein the first-mentioned flow pulses are flow spoiled pulses, and the additional flow pulses are also flow spoiled pulses.

6. A magnetic resonance imaging apparatus as in claim 3, wherein the first-mentioned flow pulses are flow spoiled pulses, and the additional flow pulses are flow compensation pulses.

7. A magnetic resonance imaging apparatus as in claim 3, wherein the first-mentioned flow pulses are flow compensation pulses, and the additional flow pulses are flow spoiled pulses.

8. A magnetic resonance imaging apparatus as in claim 1, wherein said sequence controller controls the slice selection gradient magnetic field coils to generate a slice encoding gradient magnetic field in the same direction as the slice selecting gradient magnetic field.

9. A magnetic resonance imaging (MRI) method for providing MRA image data without use of contrast agent, said method comprising:
(A) during a systolic phase of a subject's heart cycle transmitting RF pulses toward a subject while also applying a gradient magnetic field in a first spatial direction superposed with a background magnetic field $B_o$ for slice selection in the absence of contrast agent in said subject;
generating a gradient magnetic field in a second spatial direction superposed with said background magnetic field $B_o$ for phase encoding;
generating a gradient magnetic field in a third spatial direction superposed with said background magnetic field $B_o$ for frequency encoding;
(B) also performing said above-stated steps during a diastolic phase of said subject's heart cycle;
(C) during at least one of steps (A) and (B), generating magnetic gradient flow pulses superposed with said background magnetic field for dephasing or rephasing MR spin of a blood flow within the subject in the same said second spatial direction as the phase encoding gradient magnetic field;
(D) receiving MR signals from said subject during steps (A)-(C); and
(E) generating MRA image data based on the MR signal in the absence of contrast agent in said subject including a subtraction image related to a systolic phase and a diastolic phase on the basis of the MR signals acquired during the systolic phase and the diastolic phase.

10. A magnetic resonance imaging method as in claim 9, wherein the flow pulses are flow compensation pulses or flow spoiled pulses.

11. A magnetic resonance imaging method as in claim 9, wherein additional magnetic gradient flow pulses are generated in the same said third spatial direction as the frequency encoding gradient magnetic field.

12. A magnetic resonance imaging method as in claim 11, wherein the additional flow pulses are flow pulses of the same type as the first-mentioned flow pulses.

13. A magnetic resonance imaging method as in claim 11, wherein the additional flow pulses are flow pulses of a type different than the first-mentioned flow pulses.

14. A magnetic resonance imaging method as in claim 9, wherein a gradient magnetic field for slice encoding is generated in the same direction as the slice selecting gradient magnetic field.

15. A magnetic resonance imaging method for providing MRA image data without use of contrast agent, said method comprising:
executing a prep scan in the absence of contrast agent in said subject by a first pulse sequence which includes magnetic gradient flow pulses for dephasing or rephasing MR spin of a blood flow within a subject, together with RE pulses, a gradient magnetic field for slice selection, a gradient magnetic field for phase encoding and a gradient magnetic field for frequency encoding, the magnetic gradient flow pulses of the first pulse sequence being generated to produce a gradient in a background magnetic field $B_o$ oriented in the same spatial direction as the phase encoding gradient magnetic field;
determining a condition of said magnetic gradient flow pulses based on an MR signal acquired by the prep scan;
executing an MRA imaging scan in the absence of contrast agent in said subject by each of systolic and diastolic pulse sequences during respectively corresponding systolic and diastolic phases of the subject's heart cycle, at least one of said systolic and diastolic pulse sequences including magnetic gradient flow pulses corresponding to the determined condition, together with RF pulses, slice selecting gradient magnetic field, phase encoding gradient magnetic field and frequency encoding gradient magnetic field, the magnetic gradient flow pulses of the at least one pulse sequence being generated to produce a gradient in the background magnetic field $B_o$ which is oriented in the same spatial direction as said phase encoding gradient magnetic; and subtracting a systolic phase image based on said systolic pulse sequence from a diastolic chase image based on said diastolic sequence to produce an MRA image.

16. A magnetic resonance imaging method as in claim 15, wherein in said second pulse sequence, a gradient magnetic field for slice encoding is generated in the same direction as said slice selecting gradient magnetic field.

17. A magnetic resonance imaging method as in claim 15, wherein a time integral value of intensities of said flow pulses is included among conditions of said flow pulses.

18. A magnetic resonance imaging method as in claim 15, wherein distinction between a rephase type and a dephase type of said flow pulses is included among conditions of said flow pulses.

19. A magnetic resonance imaging method as in claim 15, wherein said first pulse sequence is repeatedly executed with alterations of conditions of said flow pulses.

20. An MRI system for obtaining an MRA image relating to a flowing fluid region of an object to be imaged in the absence of contrast agent in said object, said system comprising:

a cardiac phase setting component configured to set a first systolic cardiac phase and a second diastolic cardiac phase of a cardiac cycle of the object as first and second timings;

a scanning component configured to perform a first 3D scan at the first timing to acquire a first echo data set and a second 3D scan at the second timing to acquire a second echo data set, at least one of the first and second 3D scans being performed based on a pulse sequence which includes a magnetic gradient flow pulse spatially oriented in the same direction as a phase encoding magnetic gradient pulse; and an image producing component configured to produce a subtraction image from a first systolic image and a second diastolic image, the first image being generated based on the first echo data set, the second image being generated based on the second echo data set.

* * * * *